(12) United States Patent (10) Patent No.: US 8,134,158 B2
Qiu et al. (45) Date of Patent: Mar. 13, 2012

(54) TFT-LCD PIXEL UNIT AND METHOD FOR MANUFACTURING THE SAME

(75) Inventors: Haijun Qiu, Beijing (CN); Zhangtao Wang, Beijing (CN); Tae Yup Min, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/007,884

(22) Filed: Jan. 17, 2011

(65) Prior Publication Data
US 2011/0108849 A1 May 12, 2011

Related U.S. Application Data

(62) Division of application No. 11/938,416, filed on Nov. 12, 2007, now Pat. No. 7,892,897.

(30) Foreign Application Priority Data

Nov. 10, 2006 (CN) .......................... 2006 1 0145112
Nov. 10, 2006 (CN) .......................... 2006 1 0145113

(51) Int. Cl.
*H01L 33/62* (2010.01)
(52) U.S. Cl. .......................................... 257/72; 257/59
(58) Field of Classification Search .............. 257/59–72, 257/E33.053
See application file for complete search history.

(56) References Cited

U.S. PATENT DOCUMENTS

| 5,744,821 | A | * | 4/1998 | Song | 257/59 |
| 6,075,257 | A | * | 6/2000 | Song | 257/59 |
| 6,168,980 | B1 | | 1/2001 | Yamazaki et al. | |
| 7,553,711 | B2 | | 6/2009 | Park | |
| 7,682,881 | B2 | | 3/2010 | Park et al. | |
| 8,022,411 | B2 | * | 9/2011 | Yoon et al. | 257/72 |
| 8,030,654 | B2 | * | 10/2011 | Xue et al. | 257/66 |
| 2005/0139836 | A1 | | 6/2005 | Oh | |
| 2005/0270450 | A1 | | 12/2005 | Ahn et al. | |

FOREIGN PATENT DOCUMENTS

CN 1707338 A 12/2005
(Continued)

OTHER PUBLICATIONS

JPO Office Action dated Feb. 9, 2011 for corresponding Japanese Appln. No. 2007-293686(Pub. No. 2008-122968) filed Nov. 12, 2007, Japanese Text Only (3 pages), citing five Japanese publications on the second page.

*Primary Examiner* — Cuong Q Nguyen
(74) *Attorney, Agent, or Firm* — Hasse & Nesbitt LLC; Daniel F. Nesbitt

(57) ABSTRACT

A thin film transistor liquid crystal display (TFT-LCD) pixel unit and a method for manufacturing the same. The pixel unit comprises a gate line and a gate electrode formed on a substrate and a first gate insulating layer, an active layer, and a doped layer sequentially that are formed on the gate line and the gate electrode. An intercepting trench is formed on the gate line to cut off the doped layer and the active layer on the gate line. A second insulating layer covers the intercepting trench and the substrate where the gate line and the gate electrode are not formed. A pixel electrode is formed on the second insulating layer and is integrated with the second source/drain electrode.

7 Claims, 10 Drawing Sheets

FOREIGN PATENT DOCUMENTS

| | | |
|---|---|---|
| CN | 1244891 C | 3/2006 |
| JP | 02-210872 A2 | 8/1990 |
| JP | 06-163581 A2 | 6/1994 |
| JP | 09-092838 A2 | 4/1997 |
| JP | 2006-163407 A2 | 6/2006 |
| JP | 2006-301560 A2 | 11/2006 |
| KR | 2003-0073569(A) | 9/2003 |
| KR | 10-2004-0025450(A) | 3/2004 |

* cited by examiner

TFT-LCD PIXEL UNIT AND METHOD FOR MANUFACTURING THE SAME

CROSS-REFERENCE TO RELATED APPLICATIONS

This application is a divisional application of U.S. application Ser. No. 11/938,416, filed Nov. 12, 2007 now U.S. Pat. No. 7,892,897, the disclosure of which is incorporated herein by reference.

FIELD OF THE INVENTION

The present invention relates to a thin film transistor liquid crystal display (TFT-LCD) pixel unit and a method for manufacturing, the same, and more particularly, to a TFT LCD pixel unit manufactured by a three-mask photolithography process and a method for manufacturing the same.

BACKGROUND OF THE INVENTION

Recently, in fabricating a conventional TFT LCD, generally a five-mask method is applied to an array process for fabricating array substrates, and partially a four-mask method is applied. A gray tone mask has been employed to etch a source/drain metal layer and an active layer in a channel portion of a TFT in the four-mask method.

The process for such conventional four-mask method comprises the following processes.

Firstly, a gate layer is formed by a conventional gate process, and then a gate insulating layer is deposited.

Secondly, a semiconductor active layer, a doped layer, and a source/drain metal layer are deposited. A gray tone photoresist pattern can be formed with a gray tone mask so as to form an island of a TFT by etching. An ashing process is performed to partially remove the photoresist pattern and thus expose the channel portion. Then the metal layer, the doped layer, and the active layer in the channel portion are etched successively with the residual photoresist pattern. In this process, it is desired to strictly control the gray tone photoresist pattern in the channel portion. In addition, both the selective ratio and the uniformity in the etching are highly required. Therefore, there is required a strict process tolerance,

SUMMARY OF THE INVENTION

In view of the problems in the above related art, one object of the present invention is to provide a TFT-LCD pixel unit capable of decreasing the requirement for the process tolerance and simplifying the design of the TFT, and a method for manufacturing the same.

Another object of the present invention is to provide a TFT-LCD pixel unit in which a TFT is formed by a conventional photolithography process using three masks, so that the cost of array process can be reduced, the machine occupied time can be shortened, and the yield can be increased, and a method for manufacturing the same.

According to one aspect of the present invention, there is provided a TFT-LCD pixel unit. A gate line and a gate electrode are formed on a substrate. A first gate insulating layer, an active layer, and a doped layer are sequentially formed on the gate line and the gate electrode. A data line, a first source/drain electrode, and a second source/drain electrode are formed on the doped layer, the first and second source/drain electrode being separated from each other, the data line being electrically connected to the first source/drain electrode. Wherein an intercepting trench is formed on the gate line to cut off the doped layer and the active layer on the gate line. A second insulating layer covers the intercepting trench and the glass substrate without the gate line and the gate electrode. And a pixel electrode is formed on the second insulating layer integrally with the second source/drain electrode and coupled to the doped layer on the gate electrode at a position formed with the second source/drain electrode.

In embodiment, the gate line and the gate electrode is a single-layer film made of one material selected from the group consisting of AlNd, Al, Cu, Mo, MoW and Cr, or a composite film made of at least one material selected from the group consisting of AlNd, Al, Cu, Mo, MoW and Cr.

In an embodiment, the first gate insulating layer or the second insulating layer is a single-layer film made of one material selected from the group consisting of SiNx, SiOx and SiOxNy; or a composite film made of at least one material selected from the group consisting of SiNx, SiOx and SiOxNy.

In an embodiment, the first source/drain electrode, the data line or the second source/drain electrode is a single-layer film made of one material selected from the group consisting of Mo, MoW and Cr, or a composite film made of at least one material selected from the group consisting of Mo, MoW, and Cr.

According to another aspect of the present invention, there is provide a method for manufacturing a TFT-LCD pixel unit, the characteristics thereof comprising two steps.

In the step 1 with a first gray tone mask, a gate metal layer, a first gate insulating layer, an active layer, and a doped layer are sequentially deposited on a substrate. A coated photoresist layer is exposed with the first gray tone mask and developed to obtain a first photoresist pattern including a photoresist-free region, a photoresist partially retained region, and a photoresist fully retained region. The photoresist-free region is etched to form the patterns of a gate line and a gate electrode formed by the gate metal layer. An ashing process is performed on the first photoresist pattern to remove the photoresist in the photoresist partially retained region entirely and reduce a thickness of the photoresist in the photoresist fully retained region, such that a part of the doped layer on the gate line are exposed. The exposed doped layer and the active layer are etched to obtain an intercepting trench on the gate line. A second insulating layer is deposited. And a photoresist lift-off process is performed to lift off the second insulating layer above the gate line except the intercepting trench and the gate electrode.

In the step 2 with a second gray tone mask, a first metal layer is deposited on the substrate. A coated photoresist layer is exposed with the second gray tone mask and developed to obtain a second photoresist pattern including a photoresist-free region, a photoresist partially retained region, and a photoresist fully retained region. The photoresist-free region is etched by photolithography process to form a TFT channel, so that a data line and a first source/drain electrode are integrally formed by the first metal layer.

In an embodiment, in the step 2, after etching the photoresist-free region, an ashing process is performed on the photoresist to remove the photoresist in the photoresist partially retained region entirely and reduce a thickness of the photoresist in the photoresist fully retained region, such that the data line and the first source/drain electrode as a whole are exposed. And then after a passivation layer is deposited, a photoresist lift-off process is performed to lift off the passivation layer and the photoresist in a pixel electrode region and a second source/drain electrode region, such that the first metal layer is exposed. Subsequently, the exposed first metal layer is etched to expose the second insulating layer in the pixel electrode region and the doped layer in the second source/drain electrode region. In an embodiment, after the step 2, a pixel electrode film is deposited on the substrate, and exposed with a third mask and etched to integrally form a pixel electrode and a second source/drain electrode.

In an another embodiment, in the step 2, a pixel electrode layer is deposited before depositing the first metal layer, and a pixel electrode and a second source/drain electrode integrally formed by the pixel electrode layer are obtained at the time of forming the channel. After etching the photoresist-free region, an ashing process is performed on the photoresist to remove the photoresist in the photoresist partially retained region and reduce a thickness of the photoresist in the photoresist fully retained region, such that the first metal layer above the pixel electrode and the second source/drain electrode as a whole is exposed and etched, to expose the pixel electrode and the second source/drain electrode as a whole. And a photoresist lift-off process is performed to lift off the photoresist above the data line and the first source/drain electrode. In an embodiment, after the step 2, a passivation layer film is deposited on the substrate, exposed with a third mask and etched to expose the pixel electrode.

In the embodiment of the present invention, since the gate line and gate electrode, active layer, doped layer, the second insulating layer and intercepting trench on the gate line are formed with the first gray tone mask taken in conjunction with lift-off process, the cost of the array process is reduced, the machine occupied time is shortened, and the yield is increased.

In the embodiment of the present invention, since the channel, the first metal layer used to form the source/drain electrode, and the transparent pixel electrode are formed with the second gray tone mask, the cost of the array process is reduced, the machine occupied time is shortened, and the yield is increased.

Further, in the embodiment of the present invention, since the process planarization has been implemented with the second insulating layer in the first gray tone mask process, the process tolerance can be increased in the following process. In addition, in the embodiment of the present invention, the transparent metal electrode is served as drain/source electrode of TFT, therefore, the problem of contact resistance can be avoided.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The foregoing and other features and advantages of the present invention will become more apparent from the following detailed description of the exemplary embodiments when taken in conjunction with the accompanying drawings, in which:

FIG. 1d is a cross-sectional view showing the gate electrode formed by etching the gate metal layer, taken along line A-A' in FIG. 1a.

FIG. 2b is a cross-sectional view taken along line C-C' in FIG. 2a.

FIG. 3a is a plan view showing the resultant structure through exposure and development with the third conventional mask according to the first embodiment.

FIG. 3b is a cross-sectional view taken along line D-D' in FIG. 3a.

FIGS. 3c is a cross-sectional view taken along line D-D' in FIG. 3a after etching of the pixel electrode with the third conventional mask.

FIG. 3d is a cross-sectional view taken along line D-D' in FIG. 3a after photoresist lifting-off.

FIG. 5b is a cross-sectional view taken along line C-C' in the FIG. 5a.

FIG. 6b is a cross-sectional view taken along line D-D' in FIG. 6a.

DETAILED DESCRIPTION OF THE PREFERRED EMBODIMENTS

Figure 1A:
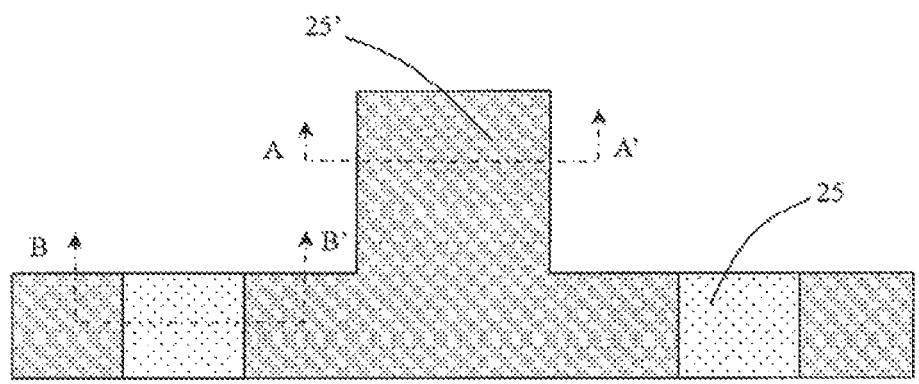
FIG. 1a is a plan view showing a photoresist pattern obtained with a first gray tone mask in a first embodiment of the present invention.

The present invention will be described in detail with reference to the accompanying drawings in which exemplary embodiments thereof are shown. The present invention may, however, be embodied in various forms and should not be construed as limited to the embodiments set forth herein. Rather, these embodiments are provided so that this disclosure will be thorough and complete, and will fully convey the concept of the invention to those skilled in the art. In the drawings, the thickness of layers and regions may be exaggerated for clarity. It will be understood that when an element or layer is referred to as being "on" or "connected to" another element or layer, it can be directly on or connected to the other element or layer, or an intervening element or layer may be present therebetween. For understanding easily, the same reference numeral is used to denote the same element common to drawings, if possible.

The embodiments of the present invention provide a pixel unit of a TFT-LCD and a method for manufacturing the same. In the method, a gate line, a gate electrode, an active layer, a doped layer, and an intercepting trench are formed with a gray tone mask in conjunction with a lift-off process, and thus the cost of the array process is reduced, the machine occupied time is shortened, and the yield is increased.

In this disclosure, the gray tone mask also comprises a half tone mask, in which a partial transparent region besides a full transparent region is formed. The partial transparent region can be realized as a slit structure in the form of a grating which reduces the transmittance of light by the scattering and diffraction of light passing therethrough, or as a translucent layer which reduces the transmittance of light passing therethrough. When a coated photoresist layer (e.g., a positive photoresist layer) is exposed with the gray tone mask, the full transparent region of the mask will completely expose the corresponding portion of the photoresist layer, while the partial transparent region will partially expose the corresponding portion of the photoresist layer. After the development of the photoresist layer, the completely exposed portion of the photoresist layer will be completely removed, while the partially exposed portion of the photoresist layer will be partially retained with a reduced thickness, so that the exposed photoresist layer is shaped into a three-dimension pattern.

The First Embodiment

A pixel unit in the TFT LCD according to the first embodiment of the present invention comprises a substrate, a gate line, a gate electrode, a first gate insulating layer, an active layer, a doped layer, a second insulating layer, first and second source/drain electrodes, a pixel electrode, a passivation layer, and the like. The first gate insulating layer, the active layer, and the doped layer are formed sequentially on the gate electrode and the gate line. An intercepting trench is formed on the gate line, and the first gate insulating layer is exposed by the intercepting trench. The second insulating layer covers the intercepting trench and the substrate on which the gate line and the gate electrode are not formed. The pixel electrode integrated with the second source/drain electrode is located above the second insulating layer, and is made contact with the doped layer on the gate electrode at a position where the second source/drain electrode is formed. The passivation layer covers the region in which the pixel electrode is not formed.

The gate line and the gate electrode may be a single-layer film formed of a material selected from the group consisting of AlNd, Al, Cu, Mo, MoW, and Cr, or a composite film formed of at least one selected from the group consisting of AlNd, Al, Cu, Mo, MoW, and Cr.

The first gate insulating layer or the second insulating layer may be a single-layer film formed of a material selected from the group consisting of SiNx, SiOx, and SiOxNy, or a composite film formed of at least one selected from the group consisting of SiNx, SiOx, and SiOxNy.

The first source/drain electrode, the data line or the second source/drain electrode may be a single-layer film formed of a material selected from the group consisting of Mo, MoW, and Cr, or a composite film formed of at least one selected from the group consisting of Mo, MoW, and Cr.

The method for manufacturing the pixel unit according to the first embodiment of the present invention may comprise the following steps.

Step 1, after a gate metal layer, a first gate insulating layer, an active layer, and a doped layer are deposited sequentially on a substrate, a coated photoresist layer is exposed by a first mask which is a gray tone mask, and is developed to obtain a photoresist pattern including a photoresist-free region, a photoresist partially retained region, and a photoresist fully retained region, in which the photoresist-free region is a region other than that for forming a gate line and a gate island, and the photoresist partially retained region is a region for forming an intercepting trench on the gate line. The photoresist-free region is etched to form patterns of the gate line and the gate island, in which the doped layer, the active layer, the first gate insulating layer, and the gate metal layer are etched. After completing the above etching, an ashing process can be performed on the photoresist pattern to entirely remove the photoresist in the photoresist partially retained region, and to reduce the thickness of the photoresist in the photoresist fully retained region, so that a part of doped layer on the gate line is exposed. Then the exposed doped layer and the active layer are etched to obtain the intercepting trench on the gate line. After a second insulating layer is deposited, a photoresist lift-off process can be performed to lift off the second insulating layer above the gate island and the gate line except the intercepting trench.

Step 2, after a first metal layer is deposited on the resultant substrate, a coated photoresist layer is exposed by a second mask which is a gray tone mask, and developed to obtain a photoresist pattern including a photoresist-free region, a photoresist partially retained region, and a photoresist fully retained region, in which the photoresist fully retained region includes a region for integrally forming a pixel electrode and a second source/drain electrode, the photoresist partially retained region includes a region for integrally forming a data line and a first source/drain electrode, and other portion on the substrate is the photoresist-free region. The photoresist-free region can be etched to a TFT channel, and thus the pattern of the data line integrated with the first source/drain electrode and the first metal layer located in a pixel electrode region and a second source/drain electrode region are formed, while the first metal layer and the doped layer are etched. After completing the etching, an ashing process can be performed on the photoresist pattern to entirely remove the photoresist in the photoresist partially retained region, and to reduce the thickness of the photoresist in the photoresist fully retained region, so that the pattern of the data line integrated with the first source/drain electrode is exposed, while a part of the photoresist is remained in the pixel electrode region and the second source/drain electrode region. After a passivation layer is deposited, a photoresist lift-off process can be performed to lift off the passivation layer and the photoresist in the pixel electrode region and the second source/drain electrode region, and then the first metal layer in the pixel electrode region and the second source/drain electrode region is etched.

Step 3, after a pixel electrode thin film is deposited on the substrate resulting from step 2, a third mask can be used to perform masking, exposure, and etching, so that the pixel electrode and the second source/drain electrode are integrally formed.

The method for manufacturing the pixel unit according to the first embodiment of the present invention and the resultant pixel unit will be described in detail with reference to the accompanying drawings.

Figure 1B:
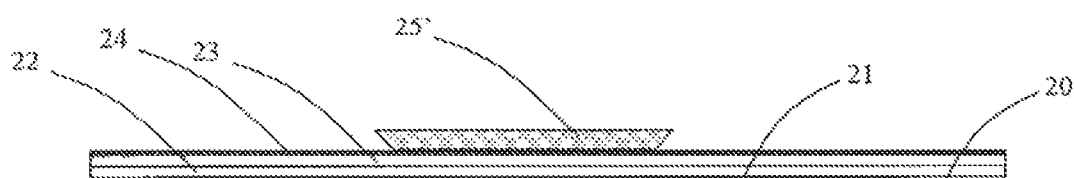
FIGS. 1b and 1c are cross-sectional views taken along lines A-A' and BB' in FIG. 1a, respectively.
Figure 1C:
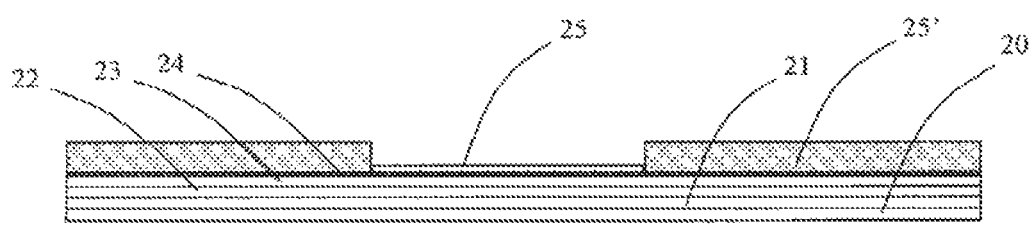

FIGS. 1a to 3d show the method for fabricating the pixel unit according to the first embodiment of the present invention, FIG. 1a is a plan view showing a photoresist pattern Obtained by exposure and development with the first gray tone mask in the first embodiment of the present invention; and FIGS. 1b and 1c are cross-sectional views taken along lines A-A' and B-B' in FIG. 1a, respectively.

First, a gate metal layer 21 (e.g., Mo, Al/Nd, Cu or the like) can be deposited on, for example, a clean glass substrate 20. A first gate insulating layer 22 (e.g., SiNx) can be deposited on the gate metal layer. A semiconductor active layer 23 (e.g., an amorphous silicon (a-Si) or a polysilicon (poly-Si) layer) can be deposited on the first gate insulating layer, and then a semiconductor doped layer 24 (e.g., a p-doped or an n-doped semiconductor layer doped with B or P) can be deposited subsequently. For example, a spin-coated photoresist layer are exposed by the first gray tone mask to obtain a photoresist pattern with the profile of the gate line and the gate island that is used to form the gate electrode, as shown in FIGS. 1a-1c. In FIG. 1a, a strip portion of the photoresist pattern extending in horizontal direction corresponds to a region for the gate line, and the island portion protruding from the strip portion corresponds to a region for the gate electrode. As shown in FIG. 1a, a photoresist-free region without photoresist is a region other than a region in which a gate line 2 (shown in FIG. 1f) and a gate electrode 1 (shown in FIG. 1d) will be formed, a first photolithographic photoresist 25 in the photoresist partially retained region is formed at the position where an intercepting trench 3 (shown in FIG. 1g) on the gate line will be formed, and a first photolithographic photoresist 25' in the photoresist fully retained region is formed on the gate electrode and the other regions of the gate tine than the intercepting trench.

Figure 1D:
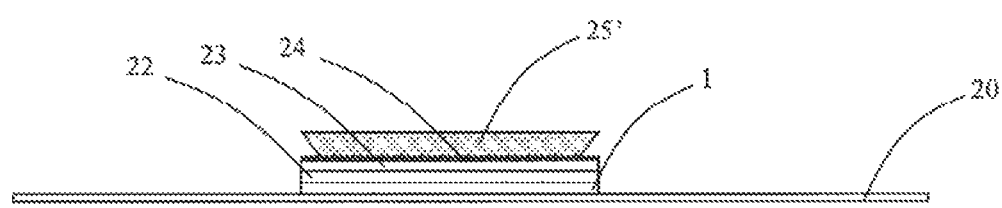
Figure 1E:
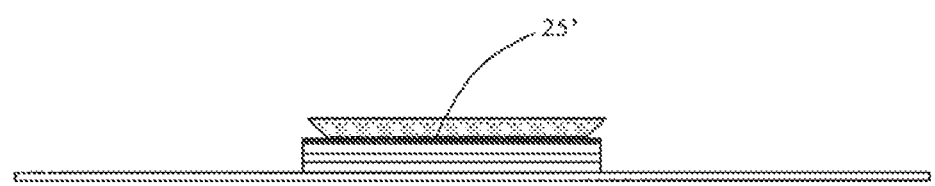
FIGS. 1e and 1f are cross-sectional views taken along lines A-A' and B-B', respectively, in FIG. 1a, after the ashing process is performed on the photoresist during the first gray tone mask step.
Figure 1F:
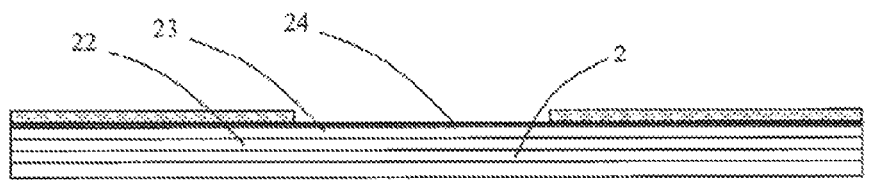
Figure 1G:
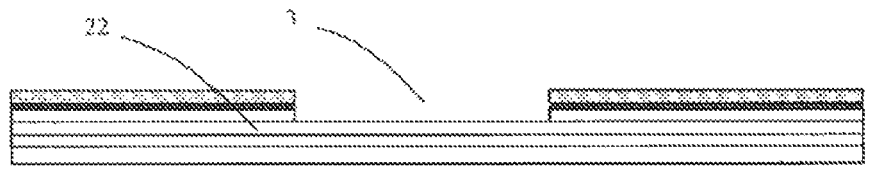
FIG. 1g is a cross-sectional view taken along line B-B' in FIG. 1a after etching the active layer during the first gray tone mask step according to the first embodiment.

The doped layer 24, the active layer 23, the first gate insulating layer 22, and the gate metal layer 21 in the photoresist-free region, which are unprotected by the photoresist layer, are sequentially etched away, the glass substrate 20 is exposed, and thus the gate electrode 1 (shown in FIG. 1d) and the gate line 2 (shown in FIG. 1f) are formed by etching the gate metal layer 21. FIG. 1d is a cross-sectional view showing the resultant structure taken along line A-A' in FIG. 1a. Then a photoresist ashing process is performed to entirely remove the photoresist 25 in the photoresist partially retained region so that a part of doped layer 24 on the gate line 2 can be exposed, and to reduce the thickness of the photoresist 25' in the photoresist fully retained region. FIGS. 1e and 1f are cross-sectional views respectively taken along lines A-A' and B-B' in FIG. 1a after the ashing process is performed on the photoresist during the first gray tone mask step according to the first embodiment of the present invention. As shown in FIG. 1f, a part of the doped layer 24 on the gate line 2 is exposed. Then the exposed doped layer 24 and the active layer 23 thereunder are etched to expose the first gate insulating layer 22, so that the intercepting trench 3 on the gate line is formed, as shown in FIG. 1g, which is a cross-sectional view taken along tine B-B' in FIG. 1a after etching the active layer during the first gray tone mask step according to the first embodiment of the present invention.

Figure 1H:
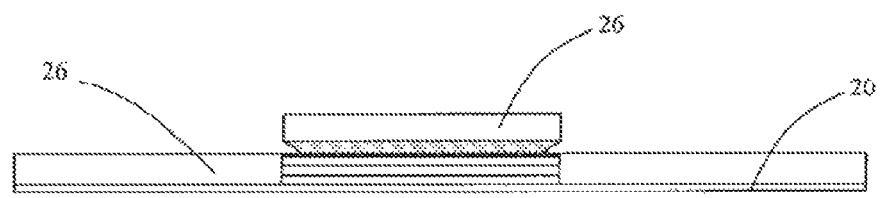
FIG. 1h is a cross-sectional view taken along line A-A' in FIG. 1a after depositing a second insulating layer according to the first embodiment.
Figure 1I:
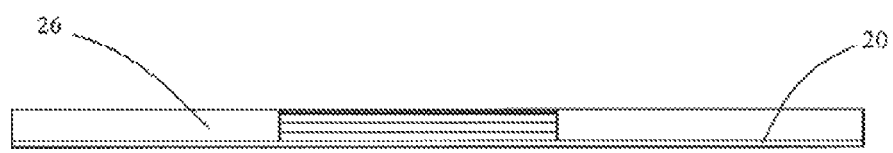
FIG. 1i is a cross-sectional view taken along lines A-A' in FIG. 1a after performing the lift-off process according to the first embodiment of the present invention.
Figure 1J:
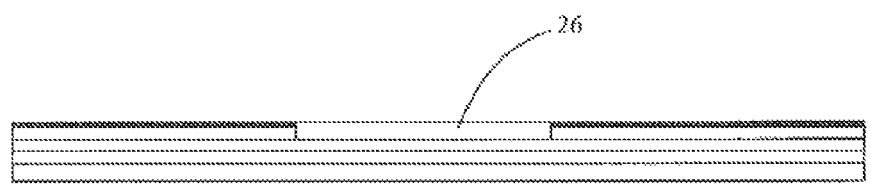
FIG. 1j is a cross-sectional view taken along lines B-B' in FIG. 1a after performing the lift-off process according to the first embodiment.

FIG. 1h is a cross-sectional view taken along line A-A' in FIG. 1a after depositing a second insulating layer according to the first embodiment of the present invention. FIGS. 1i and 1j are cross-sectional views respectively taken along lines A-A' and B-B' in FIG. 1a after performing the lift-off process according to the first embodiment of the present invention.

Figure 1K:
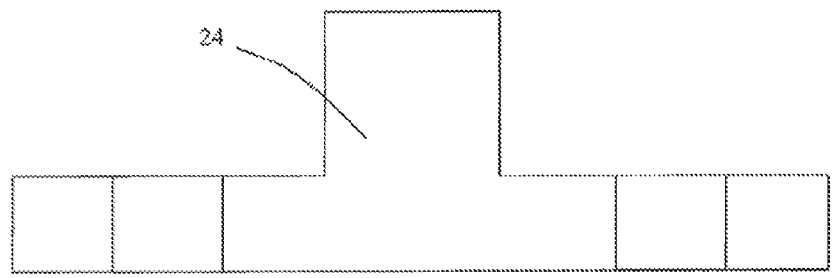
FIG. 1k shows the schematic plan view of the whole pixel obtained using the first mask in the first embodiment.

The second insulating layer 26 is blanket-deposited to protect the gate electrode 1, as shown in FIG. 1h. The second insulating layer 26 covering the photoresist layer above the gate line and the gate island can be lift off by the photoresist lift-off process. As a result, the doped layer 24 on the gate electrode 1 is exposed as shown in FIG. 1i; and the intercepting trench 3 is covered by the second insulating layer 26 as shown in FIG. 1j. It can be seen from the figures that the second insulating layer 26 can be used to planarize the resultant substrate surface substantially. Therefore, the entire process using the first mask has been accomplished in the present invention, and thus the schematic plan view of a whole pixel is obtained as shown in FIG. 1k. In FIG. 1k, the strip gate line 2 extends in horizontal direction, the gate electrode 1 protrudes from the gate line 2, and the second insulating layer 26 covers the intercepting trench 3 on the gate line 2 and the glass substrate 20 without the gate line 2 and the gate electrode 1.

Figure 2A:
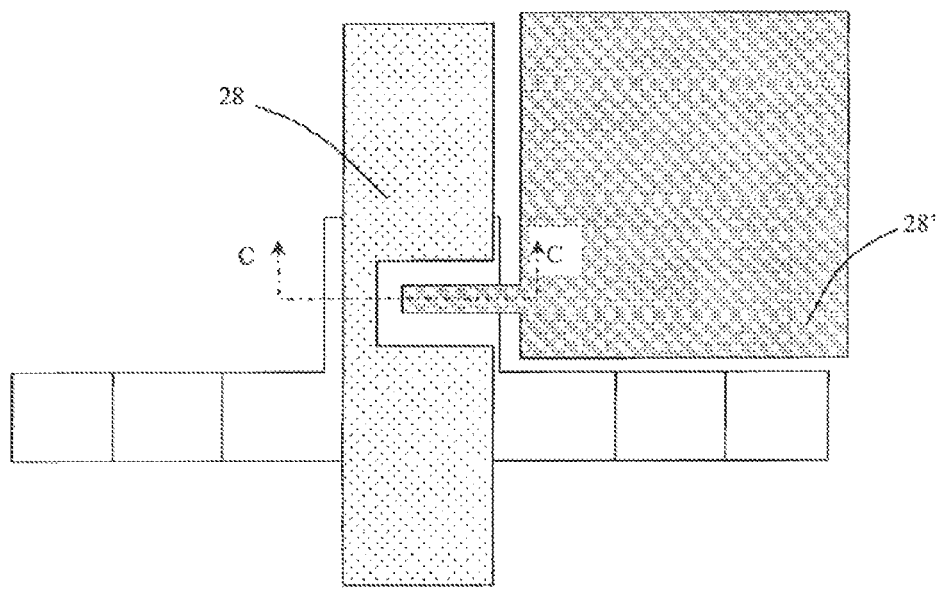
FIG. 2a is a plan view after exposure and development with a second gray tone mask according to the first embodiment.
Figure 2B:
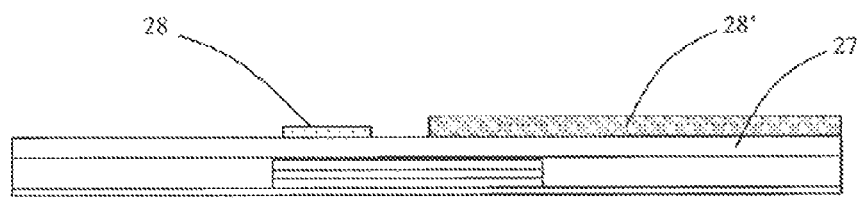

FIG. 2a is a plan view after exposure and development with a second gray tone mask according to the first embodiment of the present invention; and FIG. 2b is a cross-sectional view taken along line C-C' in FIG. 2a.

After that, a first metal layer 27 (e.g., Mo, Al, Cu or the like) and a second photolithographic photoresist are deposited sequentially on the resultant structure. After exposure with the second gray tone mask, a photoresist pattern having the profile of the data line integrated with the source electrode and the pixel electrode integrated with the drain electrode is formed, as shown by shadow in FIGS. 2a and 2b. Referring to FIG. 2b, for example, a spin-coated photoresist is exposed and developed so as to obtain a three-dimension photoresist pattern, in which a second photolithographic photoresist 28 in the photoresist partially retained region (Gray Tone) is formed in a source electrode region and a data line region, a second photolithographic photoresist 28' in the photoresist fully retained region (Full Tone) is formed in a drain electrode region and a pixel electrode region, and the other region is a photoresist-free region without photoresist.

FIGS. 2c-2g are the respective cross-sectional views taken along line C-C' (the channel position) in FIG. 2a after the photoresist-free region etching, photoresist ashing, passivation layer deposition, photoresist lifting-off, and the first metal layer etching during the second gray tone mask step according to the first embodiment of the present invention.

Figure 2C:
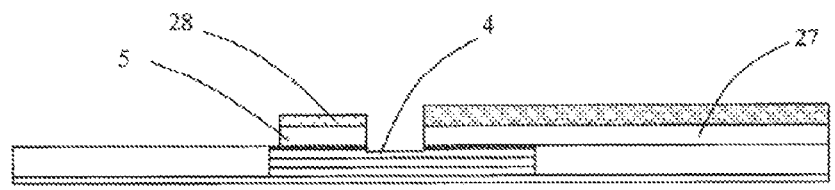
FIG. 2c is the respective cross-sectional view taken along line C-C' (the channel position) in FIG. 2a after the photoresist-free region etching during the second gray tone mask step according to the first embodiment.
Figure 2D:
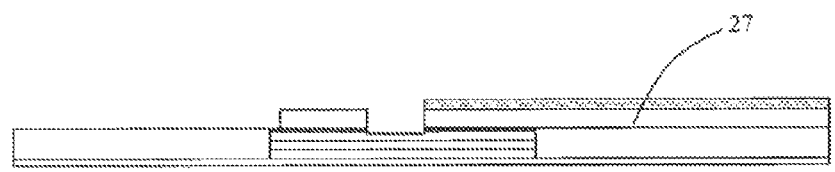
FIG. 2d is the respective cross-sectional view taken along line C-C' (the channel position) in FIG. 2a after the photoresist ashing during the second gray tone mask step according to the first embodiment.
Figure 2E:
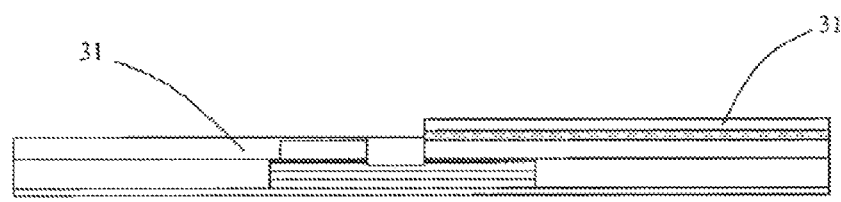
FIG. 2e is the respective cross-sectional view taken along line C-C' (the channel position) in FIG. 2a after the passivation layer deposition during the second gray tone mask step according to the first embodiment.
Figure 2F:
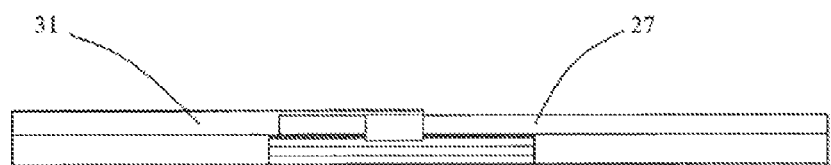
FIG. 2f is the respective cross-sectional view taken along line C-C' (the channel position) in FIG. 2a after the photoresist lifting-off during the second gray tone mask step according to the first embodiment.
Figure 2G:
FIG. 2g is the respective cross-sectional view taken along line C-C' (the channel position) in FIG. 2a after the first metal layer etching during the second gray tone mask step according to the first embodiment.

The etching is performed on the photoresist-free region (the first metal layer and the doped layer are etched), i.e., the region not being protected by the photoresist layer, so as to form a TFT channel 4, and thus the first metal layer 27 located in the pixel electrode region and the drain electrode region is formed, and the source electrode 5 and the data line 7 (extending in vertical direction in FIG. 3a) are integrally formed, as shown in FIG. 2c. Sequentially, the second photolithographic photoresist 28 in the photoresist partially retained region can be removed entirely by the photoresist ashing process, as shown in FIG. 2d, so that the source electrode and the data line are exposed and a part of photoresist 28' is remained in the drain electrode region and the pixel electrode region. A passivation layer 31 is deposited, as shown in FIG. 2e. Then the residual photoresist in the drain electrode region and the pixel electrode region together with the passivation layer are lift off by the photoresist lift-off process, so as to expose the first metal layer 27 in the drain electrode region and the pixel electrode region, as shown in FIG. 2f. Finally, the exposed first metal layer 27 is etched until the doped layer in the drain electrode region and the second insulating layer in the pixel electrode region are exposed, as shown in FIG. 2g.

Figure 3A:
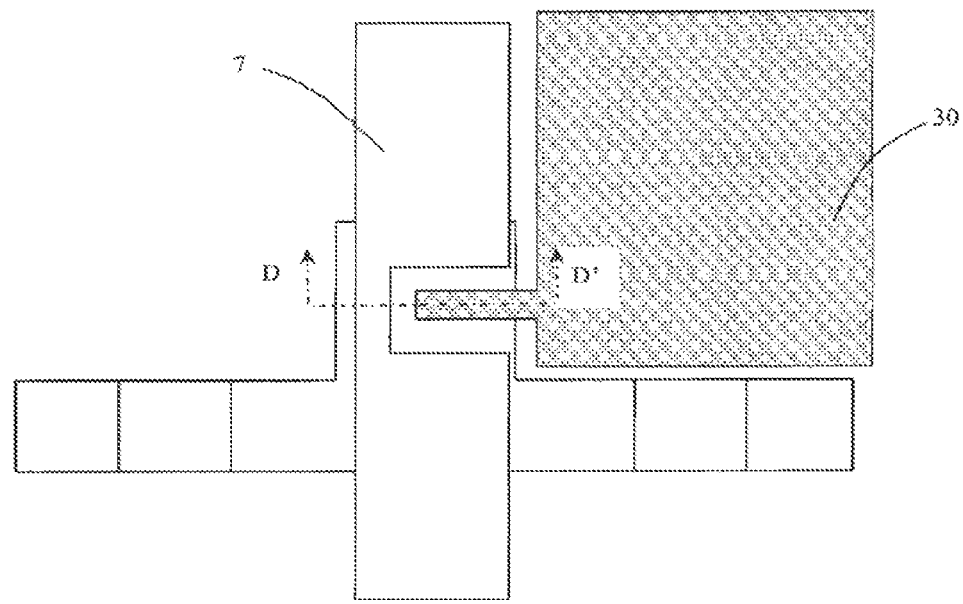
FIGS. 3a to 3d show the process steps with the third mask in the method for fabricating the pixel unit according to the first embodiment of the present invention.
Figure 3B:
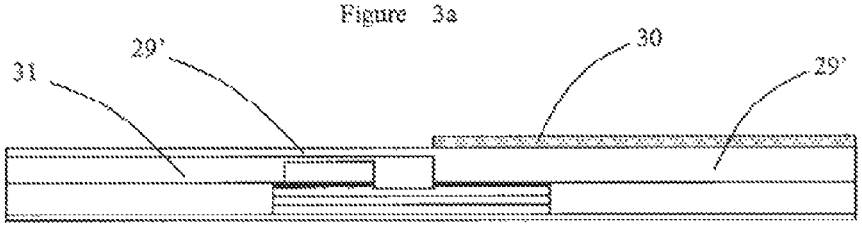
Figure 3C:
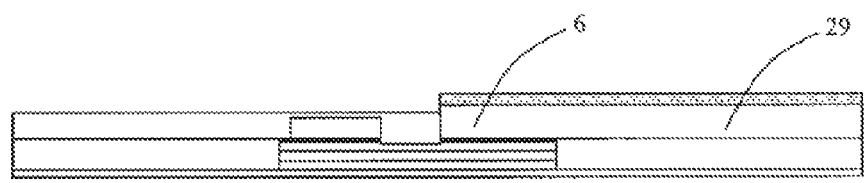
Figure 3D:
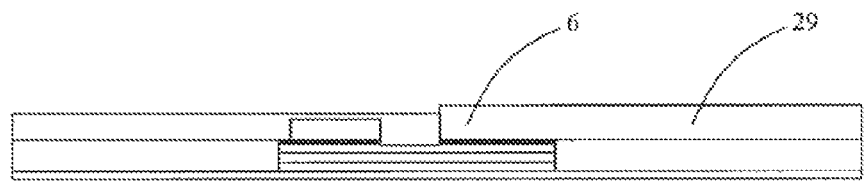

FIG. 3a is a plan view showing the resultant structure through exposure and development with the third conventional mask according to the first embodiment of the present invention; and FIG. 3b is a cross-sectional view taken along line D-D' in FIG. 3a, FIGS. 3c and 3d are cross-sectional views taken along line D-D' in FIG. 3a respectively after etching of the pixel electrode with the third conventional mask and photoresist lifting-off.

Finally, a pixel electrode layer 29' (e.g. an indium tin oxide (ITO) layer or the like) is deposited on the resultant structure, and a third photolithography photoresist 30 is obtained by exposure with the third conventional mask, as shown in FIGS. 3a and 3b. After that, the pixel electrode layer 29' is etched to remove the pixel electrode layer 29' exposed by the photoresist 30, so that the pixel electrode 29 and the drain electrode 6 are integrally formed, and the drain electrode 6 is made contact with the doped layer 24, as shown in FIG. 3c. In the end, the photoresist lift-off process is performed to expose the pixel electrode 29 and the drain electrode 6, and thus the final pattern shown in FIG. 3d is obtained.

The Second Embodiment

A pixel unit in the TFT LCD according to the second embodiment of the present invention comprises a substrate, a gate line, a gate electrode, a first gate insulating layer, an active layer, a doped layer, a second insulating layer, first and second source/drain electrodes, a pixel electrode, and a passivation layer and so on. The first gate insulating layer, the active layer, and the doped layer are formed sequentially on the gate electrode and the gate line. An intercepting trench is formed on the gate line to cut off the doped layer and the active layer on the gate line. The second insulating layer covers the intercepting trench and the glass substrate where the gate line and the gate electrode are not formed. The pixel electrode integrated with the second source/drain electrode is located above the second insulating layer, and is in contact with the doped layer on the gate electrode at the position where the second source/drain electrode is formed. A transparent pixel electrode layer is retained under the first source/drain electrode and the data line. The passivation layer covers the region without the pixel electrode.

The method for manufacturing the pixel unit according to the second embodiment of the present invention comprises the following steps.

Step 1, after a gate metal layer, a first gate insulating layer, an active layer, and a doped layer are deposited sequentially on a substrate, a coated photoresist layer is exposed by a first mask which is a gray tone mask and is developed to obtain a photoresist pattern including a photoresist-free region, a photoresist partially retained region, and a photoresist fully retained region. The photoresist-free region is the region other than that for forming the gate line and a gate island for forming the gate electrode; and the photoresist partially retained region is the region for forming the intercepting trench on the gate line. The photoresist-free region is etched to form the patterns of the gate line and the gate island, in which the doped layer, the active layer, the first gate insulating layer, and the gate metal layer are etched. After completing the above etching, an ashing process can be performed on the photoresist pattern to entirely remove the photoresist in the photoresist partially retained region and to reduce the thickness of the photoresist in the photoresist fully retained region, so that a part of doped layer on the gate line is exposed. Then the exposed doped layer and the active layer thereunder are etched to obtain the intercepting trench on the gate line. After a second insulating layer is deposited, the photoresist lift-off process can be performed to lift off the second insulating layer above the gate line and the gate island.

Step 2, after a transparent pixel electrode layer and a first metal layer are deposited on the substrate after completing the step 1, a coated photoresist layer is exposed by the second mask which is a gray tone mask to obtain a photoresist pattern including a photoresist-free region, a photoresist partially retained region, and a photoresist fully retained region. The photoresist fully retained region includes the region for integrally forming a data line and a first source/drain electrode; the photoresist partially retained region includes the region for integrally forming a transparent pixel electrode and a second source/drain electrode; and other portion is the photoresist-free region. The photoresist-free region can be etched to form a TFT channel, and thus the pattern of the pixel electrode and the second source/drain electrode as a whole and the pattern of the data line and the first source/drain electrode as a whole are obtained, while the first metal layer, the pixel electrode layer, and the doped layer are etched. After completing the above etching, an ashing process can be performed on the photoresist pattern to entirely remove the photoresist in the photoresist partially retained region and to reduce the thickness of the photoresist in the photoresist fully retained region, so that the first metal layer above the pattern of the pixel electrode and the second source/drain electrode is exposed. And then the exposed first metal layer is etched to expose the pixel electrode and the second source/drain electrode as a whole. Finally, the photoresist above the data line and the first source/drain electrode are lift off by a photoresist lift-off process.

Step 3, a passivation layer film is deposited on the substrate resulting from step 2, and the third mask can be used to perform exposing and etching, so that the pixel electrode pattern is exposed.

The method for manufacturing the pixel unit according to the second embodiment of the present invention and the resultant pixel unit will be described in detail with reference to the accompanying drawings.

FIGS. 4a through 6c show the method for manufacturing the pixel unit according to the second embodiment of the present invention. The process steps using the first mask shown in FIGS. 4a to 4k are the same as the above steps according to the first embodiment, thus the detail description thereof is omitted.

Figure 5A:
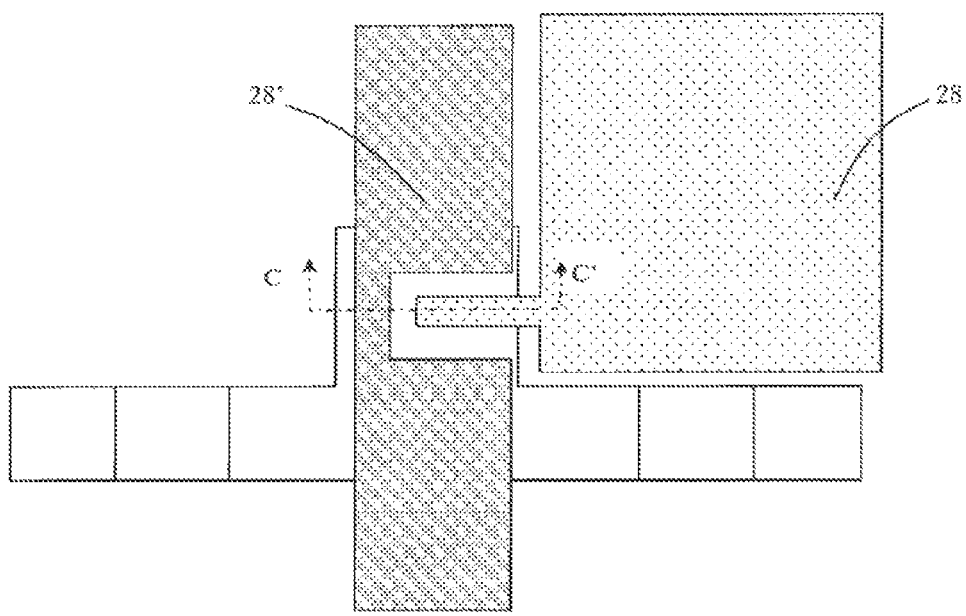
FIG. 5a is a plan view obtained by exposure with the second gray tone mask and development according to the second embodiment.
Figure 5B:
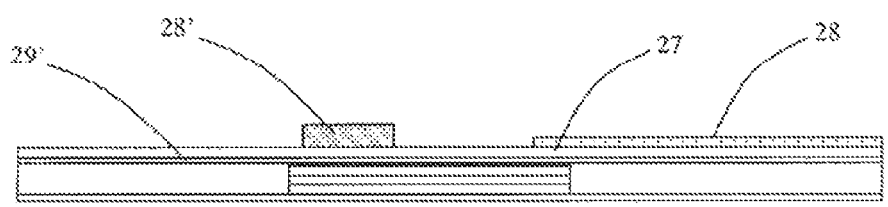

FIG. 5a is a plan view obtained by exposure with the second gray tone mask and development according to the second embodiment of the present invention, and FIG. 5b is a cross-sectional view taken along line C-C' in the FIG. 5a.

Figure 4A:
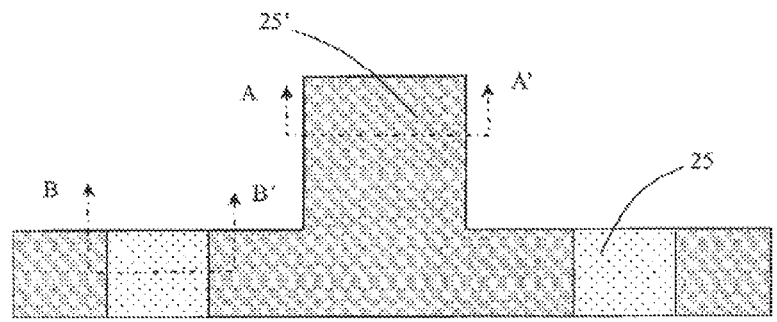
FIG. 4a is a plan view showing a photoresist pattern obtained with a first gray tone mask in a second embodiment of the present invention.
Figure 4B:
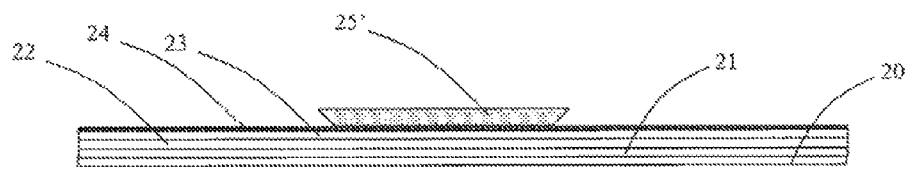
FIGS. 4b and 4c are cross-sectional views taken along lines A-A' and B-B' in FIG. 4a, respectively.
Figure 4C:
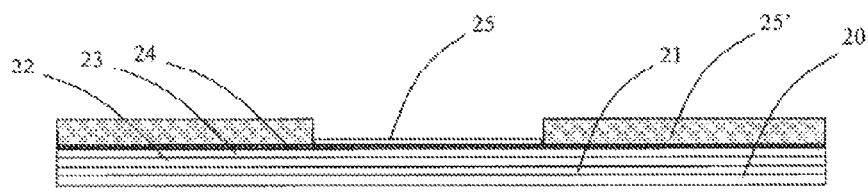
Figure 4D:
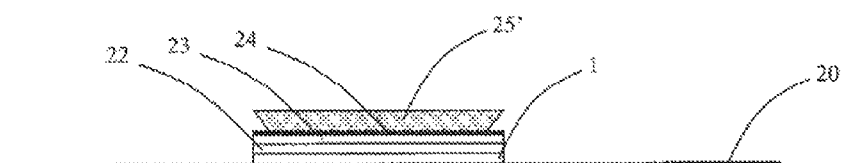
FIG. 4d is a cross-sectional view showing the gate electrode formed by etching the gate metal layer, taken along line A-A' in FIG. 4a, FIGS. 4e and 4f are cross-sectional views taken along lines A-A' and B-B', respectively, in FIG. 4a, after the ashing process is performed on the photoresist during the first gray tone mask step in the second embodiment.
Figure 4E:
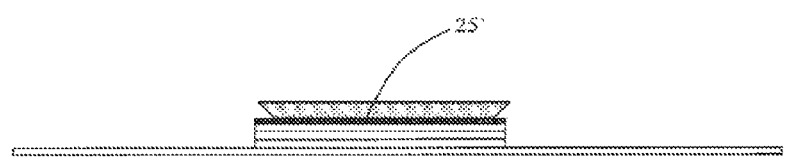
FIG. 4g is a cross-sectional view taken along line B-B' in FIG. 4a after etching the active layer during the first gray tone mask step according to the first embodiment.
FIG. 4h is a cross-sectional view taken along line A-A' in FIG. 4a after depositing a second insulating layer according to the first embodiment.
FIG. 4i is a cross-sectional view taken along line A-A' in FIG. 4a after performing the lift-off process according to the second embodiment of the present invention.
FIG. 4j is a cross-sectional view taken along line B-B' in FIG. 4a after performing the lift-off process according to the second embodiment.
FIG. 4k shows the schematic plan view of the whole pixel obtained using the first mask in the second embodiment.
Figure 4F:
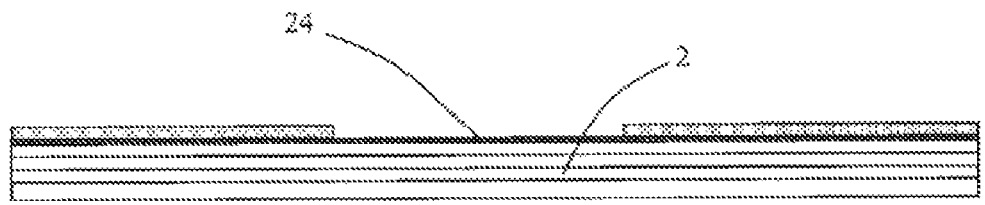
Figure 4G:
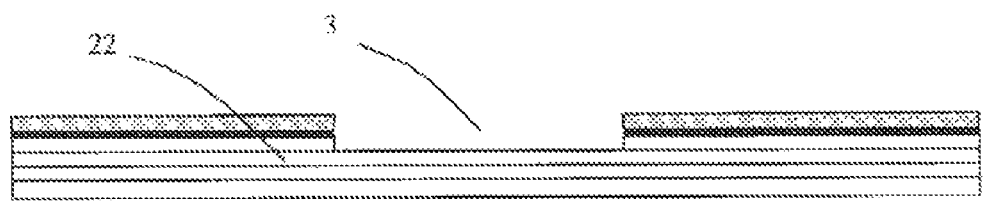
Figure 4H:
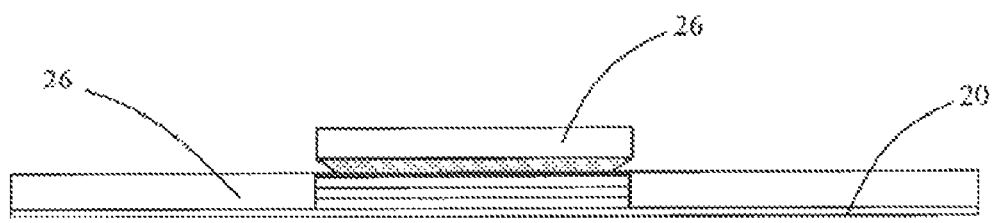
Figure 4I:
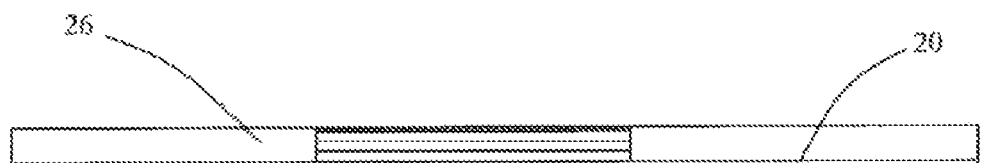
Figure 4J:
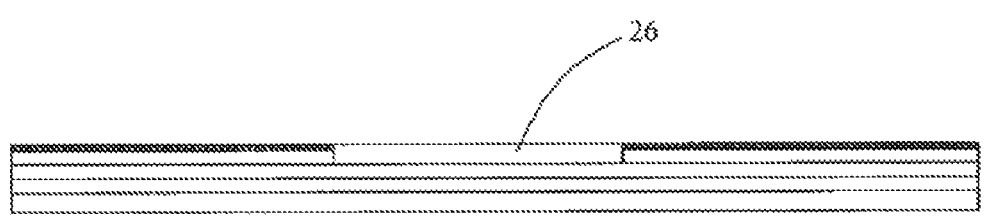
Figure 4K:
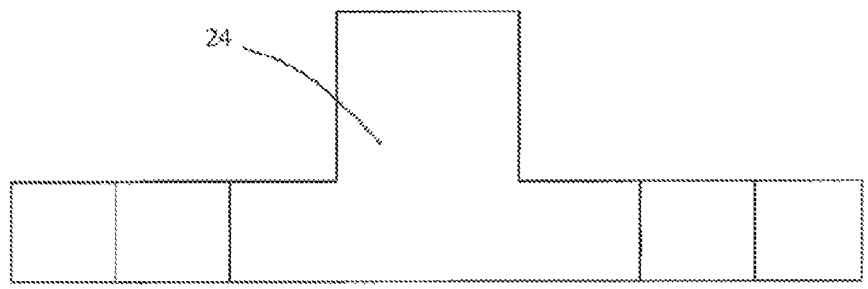

A transparent pixel electrode layer 29' (e.g., an indium tin oxide (ITO) or the like) and the first al layer 27 (e.g., Mo, Al, Cu or the like) are deposited sequentially on the resultant structure shown in FIG. 4k. A photoresist pattern (shown in shadow portion), which has the profile of data line integrated with the source electrode and the pixel electrode integrated with the drain electrode, is formed by exposure with the second gray tone mask, as shown in FIGS. 5a and 5b. Referring to FIG. 5b, for example a spin-coated photoresist is exposed and developed to obtain a three-dimension photoresist pattern, wherein the second photolithographic photoresist 28' of the photoresist fully retained region (Gray Tone) is thick, while the second photolithographic photoresist 28 of the photoresist partially retained region (Full Tone) is thin. The source electrode and the data line are to be formed in the photoresist fully retained region, the drain electrode and the pixel electrode are to be formed in the photoresist partially retained region, and the other region is the photoresist-free region without photoresist.

FIGS. 5c-5f are respective cross-sectional views taken along line C-C' in FIG. 5a after the photoresist-free region etching, photoresist ashing, the first metal layer depositing, and photoresist lifting-off during the second gray tone mask step according to the second embodiment of the present invention.

Figure 5C:
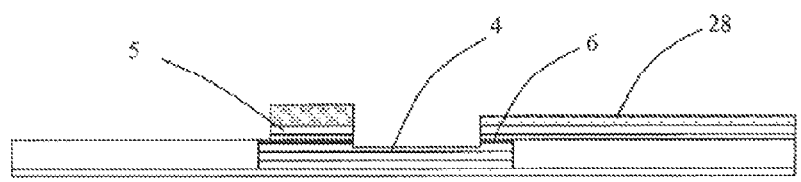
FIG. 5c is a cross-sectional view taken along line C-C' (the channel position) in FIG. 2a after the photoresist-free region etching during the second gray tone mask step according to the second embodiment.
Figure 5D:
FIG. 5d is a cross-sectional view taken along line C-C' (the channel position) in FIG. 2a after the photoresist ashing during the second gray tone mask step according to the second embodiment.
Figure 5E:
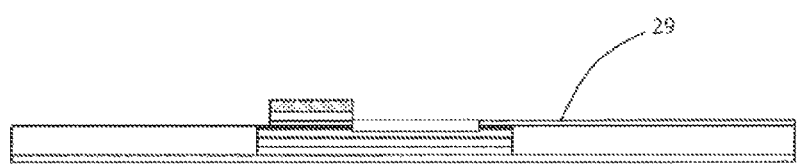
FIG. 5e is a cross-sectional view taken along line C-C' (the channel position) in FIG. 2a after the first metal layer depositing during the second gray tone mask step according to the second embodiment.
Figure 5F:
FIG. 5f is a cross-sectional view taken along line C-C' (the channel position) in FIG. 2a after photoresist lifting-off during the second gray tone mask step according to the second embodiment.

The etching is performed on the photoresist-free region (etching of the first metal layer, the transparent electrode layer, and the doped layer), i.e., the region without protection of the photoresist layer, so as to form a TFT channel 4, as shown in FIG. 5c. At this time, the source electrode 5 and the data line (not shown) are integrally formed by etching the first metal layer, and the pixel electrode 29 and the drain electrode 6 are integrally formed by etching the transparent pixel electrode layer. The drain electrode contacts the doped layer 24 directly, and the source electrode 5 and a part of the data line contact the doped layer 24 through the transparent pixel electrode layer retained thereunder. Subsequently, the second photolithographic photoresist 28 of the photoresist partially retained region can be removed entirely by the photoresist ashing process, as shown in FIG. 5d, so that the first metal layer 27 above the drain electrode and the pixel electrode is exposed, meanwhile the thickness of the photoresist 28' in the photoresist fully retained region is reduced. The exposed first metal layer is etched with the photoresist 28' until the pixel electrode 29 and the drain electrode as a whole are exposed, as shown in FIG. 5e. Since a certain thickness of the photoresist 28' is still remained in the source electrode region and the data line region during the ashing process, the source electrode 5 and the data line are protected by the photoresist 28' and thus retained. Then the residual photoresist 28' retained in these portions can be lift off by a photoresist lift-off process, so as to expose the source electrode 5 and the data line as a whole, as shown in FIG. 5f.

Figure 6A:
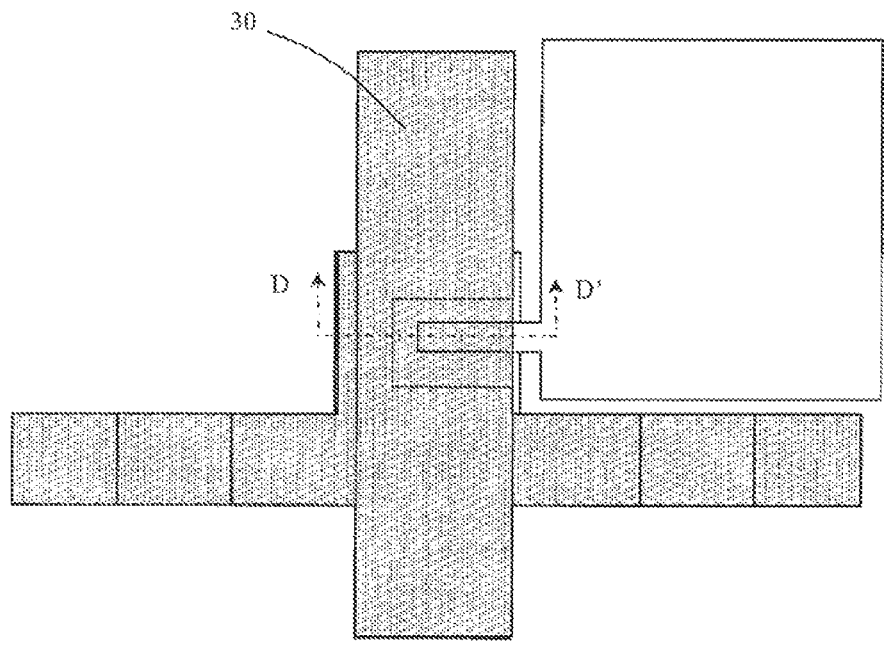
FIG. 6a is a plan view showing the resultant structure through exposure and development with a third conventional mask according to the second embodiment.
Figure 6B:
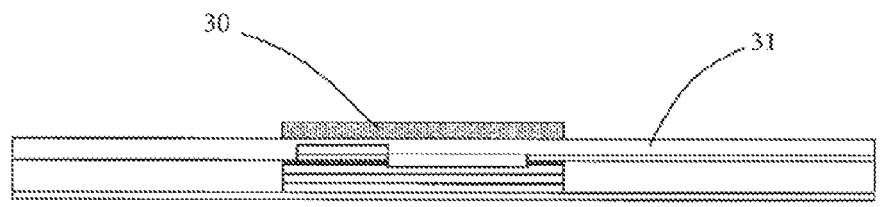
Figure 6C:
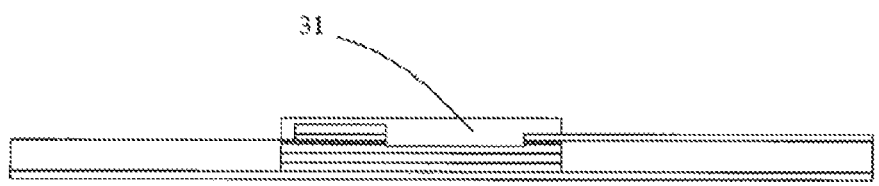
FIG. 6c is a cross-sectional view taken along line D-D' in FIG. 6a after passivation layer etching and photoresist lifting off during the third conventional mask step.

FIG. 6a is a plan view showing the resultant structure through exposure and development with a third conventional mask according to the second embodiment of the present invention; and FIG. 6b is a cross-sectional view taken along line D-D' in FIG. 6a, FIG. 6c is a cross-sectional view taken along line D-D' in FIG. 6a after passivation layer etching and photoresist lifting off during the third conventional mask step.

Finally, a passivation layer 31 (e.g., SiNx or the like) is deposited on the resultant structure, and the exposure and development with the third conventional mask are performed to form a photoresist pattern, so that a third photolithography photoresist 30 is obtained, as shown in FIGS. 6a and 6b. After that, the passivation layer is etched to expose pattern of the pixel electrode, and then the photoresist lift-off process is performed to remove the photoresist, thus the final pattern can be formed, as shown in FIG. 6c.

In the above second embodiment, the data line and the source electrode can be integrally formed by patterning the first metal layer, and the pixel electrode and the drain electrode can be integrally formed by patterning the pixel electrode layer. In other embodiments, the data line and the drain electrode can also be integrally formed by patterning the first metal layer, and the pixel electrode and the source electrode can be integrally formed by patterning the pixel electrode layer.

The above illustrated embodiments are exemplary manufacturing methods, while other methods can also be implemented by choosing various materials or their combination or by selecting various photolithography processes. It is apparent that the structure of TFT device may have various modifications and change in the position and direction of TFT and the overlapping mode of the gate electrode with the source/drain electrode. These modifications and change are included in the scope of the present invention.

In the foregoing description, the photoresist ashing process, the lift-off process and the like are well known in the art, so the detailed description for those are omitted herein.

In an embodiment, the gate line and the gate electrode, the active layer, the doped layer, the second insulating layer, and the intercepting trench on the gate line are formed with the first gray tone mask in conjunction with the lift-off process. At this time, the channel and the first metal layer used to form the source/drain electrode are formed with the second gray tone mask. Thus the cost of the array process may be reduced, the machine occupied time may be shortened, and the yield may be increased.

In another embodiment, the gate line and the gate electrode, the active layer, the doped layer, the second insulating layer, and the intercepting trench on the gate line are formed with the first gray tone mask in conjunction with the lift-off process. At this time, the channel, the first metal layer used to form the source/drain electrode, and the transparent pixel electrode are formed with the second gray tone mask. Thus, the cost of the array process is reduced, the machine occupied time is shortened, and the yield is increased.

Further, since the planarization has been implemented with the second insulating layer in the step using the first gray tone mask, the process tolerance can be increased in the subsequent steps. In addition, the transparent electrode is served as drain/source electrode of TFT, and therefore the problem of contact resistance can be avoided, It should be appreciated that the embodiments described above are intended to illustrate but not limit the present invention. Although the present invention has been described in detail herein in connection with the preferred embodiments, it should be understood by those skilled in the art that the present invention can be realized with different materials and equipments as necessary, and that various modification and equivalents thereof can be made herein without departing from the spirit and scope of the present invention as defined in the appended claims.

What is claimed is:

1. A thin film transistor liquid crystal display (TFT-LCD) pixel unit, comprising:
    a gate line and a gate electrode formed on a substrate;
    a first gate insulating layer, an active layer, and a doped layer sequentially formed on the gate line and the gate electrode; and
    a data line, a first source/drain electrode, and a second source/drain electrode formed on the doped layer, the first and second source/drain electrodes being separated apart from each other, the data line being electrically connected to the first source/drain electrode,
    wherein an intercepting trench is formed on the gate line to cut off the doped layer and the active layer on the gate line; a second insulating layer covers the intercepting trench and the substrate where the gate line and the gate electrode are not formed; and a pixel electrode is formed on the second insulating layer integrally with the second source/drain electrode and contacts the doped layer on the gate electrode at a position where the second source/drain electrode is formed.

2. The pixel unit as claimed in claim 1, further comprising a passivation layer covering the substrate where the pixel electrode is not formed.

3. The pixel unit as claimed in claim 1, wherein a surface of the second insulating layer is substantially flush with a surface of the doped layer.

4. The pixel unit as claimed in claim 1, wherein a pixel electrode layer for forming the pixel electrode is retained under the first source/drain electrode and the data line.

5. The pixel unit as claimed in claim 1, wherein the gate line and the gate electrode are a single-layer film made of one material selected from the group consisting of AlNd, Al, Cu, Mo, MoW and Cr, or a composite film made of at least one material selected from the group consisting of AlNd, Al, Cu, Mo, MoW and Cr.

6. The pixel unit as claimed in claim 1, wherein the first gate insulating layer and the second insulating layer are a single-layer film made of one material selected from the group consisting of SiNx, SiOx and SiOxNy; or a composite film made of at least one material selected from the group consisting of SiNx, SiOx and SiOxNy.

7. The pixel unit as claimed in claim 1, wherein the first source/drain electrode, the data line and the second source/drain electrode are a single-layer film made of one material selected from the group consisting of Mo, MoW and Cr, or a composite film made of at least one material selected from the group consisting of Mo, MoW and Cr.

* * * * *